United States Patent [19]

Bush et al.

[11] 3,991,322
[45] Nov. 9, 1976

[54] SIGNAL DELAY MEANS USING BUCKET BRIGADE AND SAMPLE AND HOLD CIRCUITS

[75] Inventors: John A. Bush, Sunol; Michael Alexander Boutte, Mountain View, both of Calif.

[73] Assignee: California Microwave, Inc., Sunnyvale, Calif.

[22] Filed: June 30, 1975

[21] Appl. No.: 591,659

[52] U.S. Cl. .................. 307/221 D; 307/235 B; 307/293; 307/304; 328/151
[51] Int. Cl.² ............ G11C 19/00; H03K 5/13; H03K 3/353
[58] Field of Search ............ 307/221 D, 293, 304, 307/221 C, 235 B; 357/24; 328/151

[56] References Cited
UNITED STATES PATENTS

| | | |
|---|---|---|
| 3,474,260 | 10/1969 | Frohbach .................. 307/221 D |
| 3,676,711 | 7/1972 | Ahrons ........................ 307/293 |
| 3,781,574 | 12/1973 | White et al. ................ 307/221 D |
| 3,819,953 | 6/1974 | Puckette et al. ............ 307/221 D |

*Primary Examiner*—Stanley D. Miller, Jr.
*Attorney, Agent, or Firm*—Boone, Schatzel, Hamrick & Knudsen

[57] ABSTRACT

A signal delay apparatus for delaying an information signal and including a bucket brigade device for sampling the signal and time delaying the samples, a sample-and-hold device for sampling and storing the voltage levels of the individual delayed samples in succession, and a clock for developing timing signals for controlling the delay line and the sample-and-hold device.

9 Claims, 4 Drawing Figures

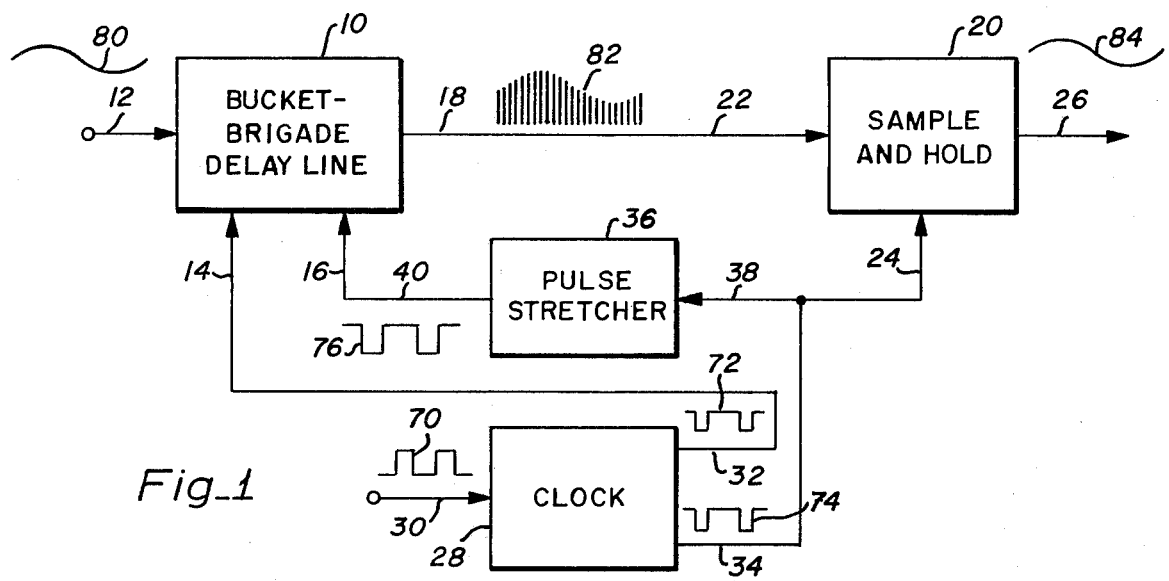
Fig_1
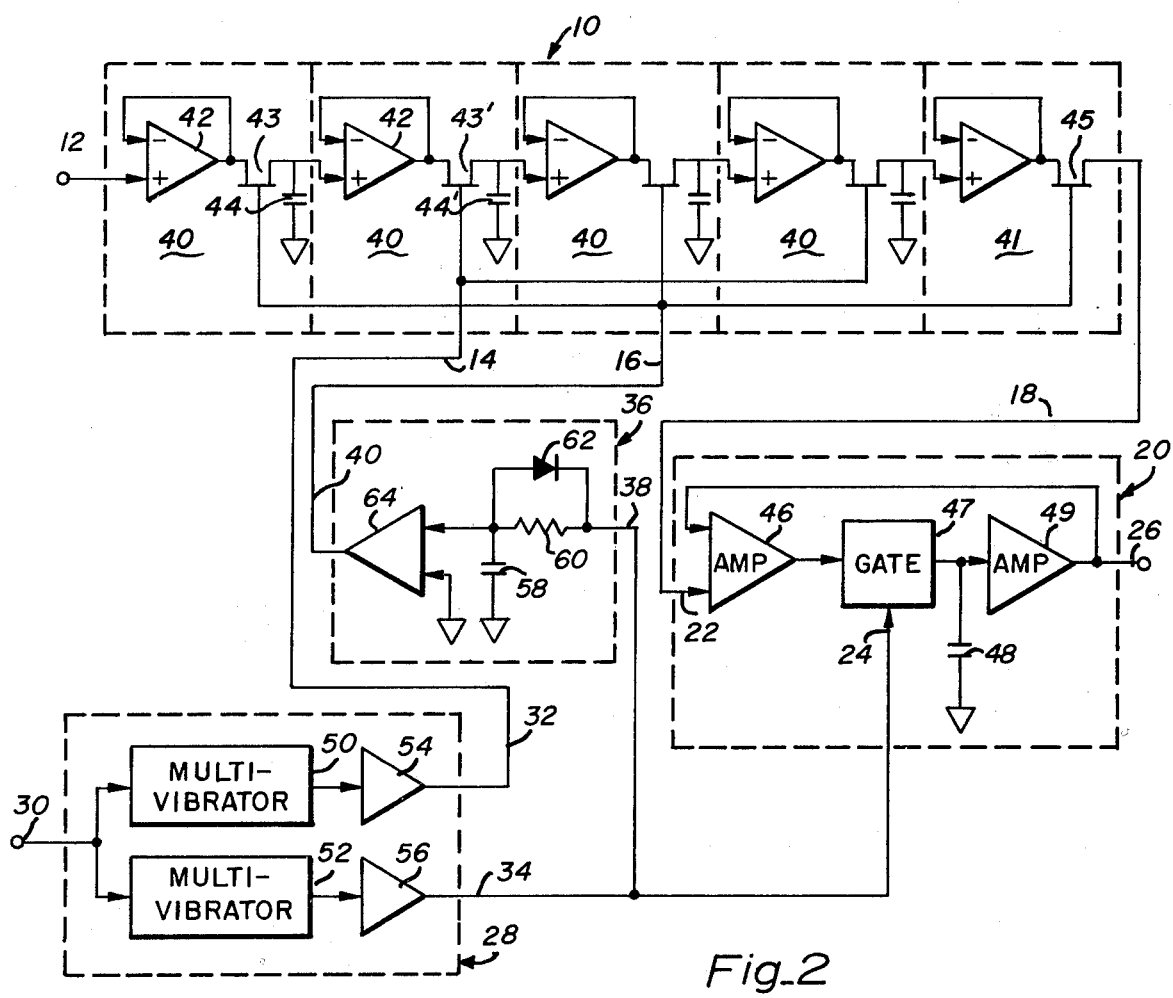
Fig_2

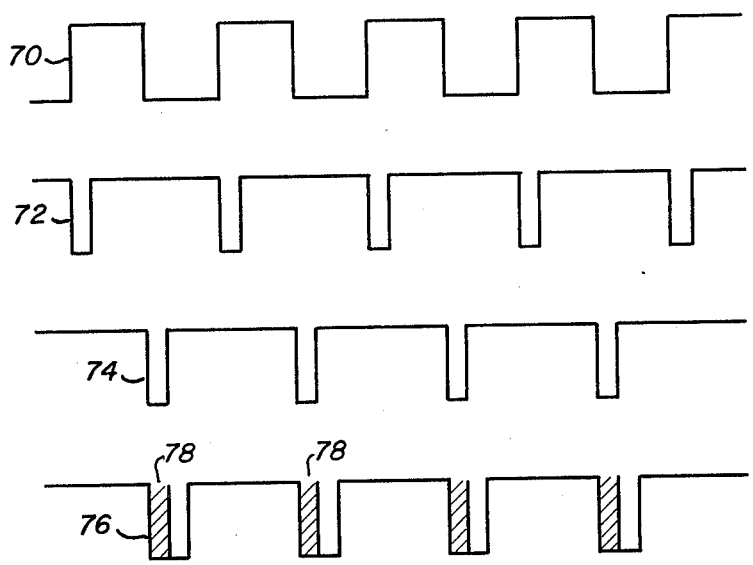
Fig_3
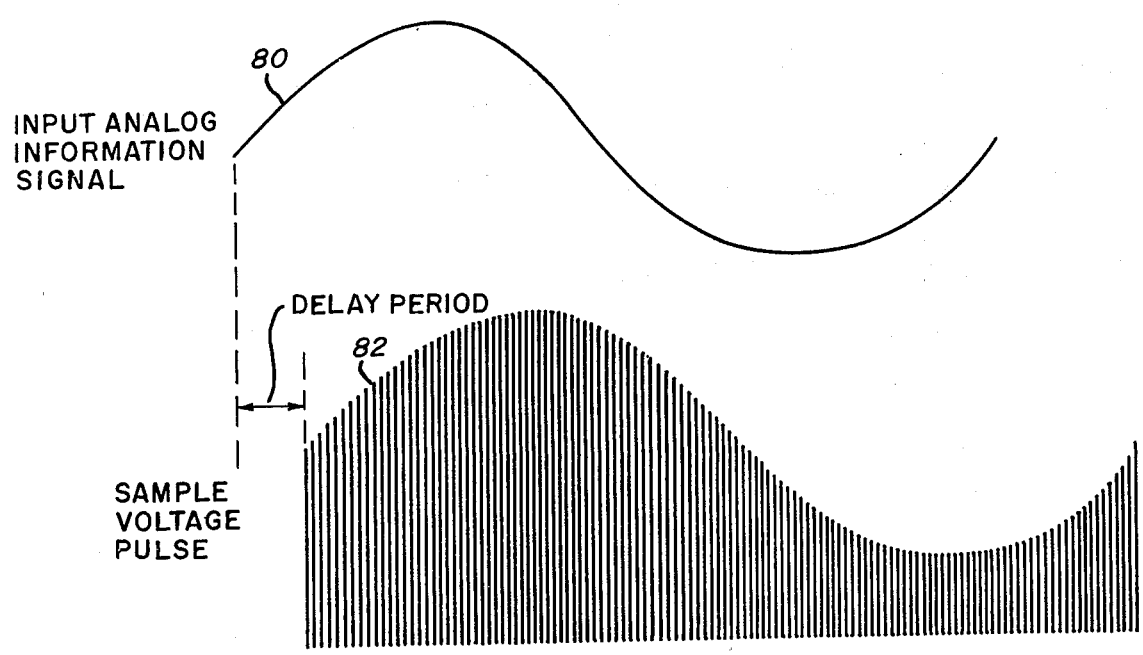
INPUT ANALOG INFORMATION SIGNAL
DELAY PERIOD
SAMPLE VOLTAGE PULSE
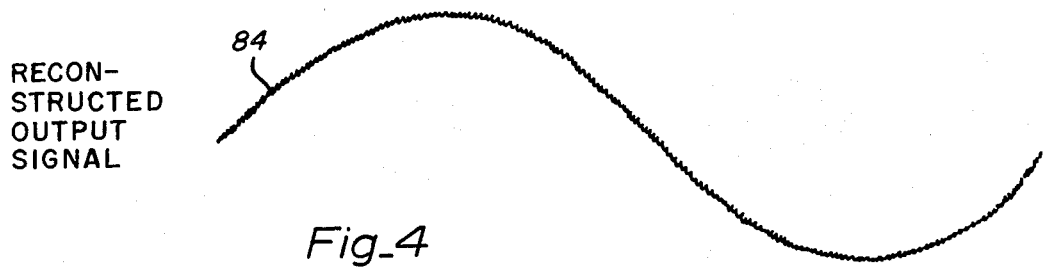
RECONSTRUCTED OUTPUT SIGNAL
Fig_4

SIGNAL DELAY MEANS USING BUCKET BRIGADE AND SAMPLE AND HOLD CIRCUITS

BACKGROUND OF THE INVENTION

1. Field of the Invention

The present invention relates generally to communications equipment, and more particularly, to an improved signal delay circuit having low insertion loss and phase linearity for use in FM communications systems.

2. Description of the Prior Art

In both the transmit and receive circuits of FM communications systems, it is often necessary to delay a particular signal in order to improve the performance of the system. For example, in transmitter circuits it is sometimes necessary to delay the information signal to allow time for a detector to detect the information signal in order to contemporaneously modulate and transmit the carrier signal. Similarly, a delay may be necessary in demodulator squelch circuits to effect the elimination of noise from the demodulated information signal.

Prior art delay circuits are undesirable because of the high cost of elaborate generators, filters and phase linearity compensators required to eliminate their associated noise and resulting signal degradation.

SUMMARY OF THE PRESENT INVENTION

It is therefore a primary object of the present invention to provide an improved delay circuit having low insertion loss and low phase distortion characteristics.

Briefly, the preferred embodiment includes a bucket brigade delay line for converting an input analog information signal into a series of pulses having amplitudes which correspond to particular segments of the input signal but displaced in time relative thereto, a sample-and-hold device for using the series of pulses to reconstruct the input analog signal, and a clock for generating pulses which synchronize and control the delay line and the sample-and-hold device. The reconstructed signal is continuous, low in phase distortion, and delayed by a predetermined period of time relative to the input signal.

A principal advantage of the present invention is that it utilizes readily available electronic components to provide a delayed signal without phase distortion.

Another advantage of the present invention is that the insertion loss due to its introduction into the circuit is low.

A further advantage of the present invention is that since little output filtering is required, better overall phase linearity is achieved and less overall circuit complexity is required.

A still further advantage of the present invention is that the delayed signal has a high signal-to-noise ratio and is free of phase nonlinearity.

A still further advantage of the present invention is that the delay circuit's performance is dependent solely upon the rate of the clocking pulses and not upon their duty factors.

Other objects and advantages of the present invention will no doubt become apparent to those skilled in the art after having read the following detailed description of the preferred embodiment which is illustrated in the drawing.

IN THE DRAWING

FIG. 1 is a block diagram illustrating a preferred embodiment of the delayed circuit in accordance with the present invention;

FIG. 2 is a schematic representation of the delay circuit of FIG. 1;

FIG. 3 is a timing diagram illustrating the various timing signals used in the circuit; and FIG. 4 is a diagram illustrating operation of the present invention.

DETAILED DESCRIPTION OF THE PREFERRED EMBODIMENT

Referring now to FIG. 1 of the drawing, there is shown a delay circuit in accordance with the preferred embodiment of the present invention which includes a bucket brigade delay line 10 having a signal input 12, control inputs 14 and 16, and an output 18, a sample-and-hold device 20 having a signal input 22, a control input 24, and an output 26, a clock 28 having an input 30 and outputs 32 and 34, and a pulse stretcher 36 having an input 38 and an output 40.

In this embodiment, an externally generated square-wave 70 input at terminal 30 is used by clock 28 to generate a pair of timing signals 72 and 74 on lines 32 and 34, respectively, which are 180° out of phase with each other. In response to the application of signal 72 to control input 14 and the application of a stretched version 76 of signal 74 to control input 16, bucket brigade delay line 10 converts an information signal 80 input at terminal 12 into a series of sample voltage pulses 82 having amplitudes which correspond to the amplitudes of certain segments of the input signal but which are displaced in time relative thereto.

Sample-and-hold circuit 20 responds to the signal 74 applied to input 24, sequentially sampling each of the sample voltage pulses in the series 82, and holding each sample voltage level until the next pulse is sampled. The resulting series of voltage levels form the reconstructed information signal 84 which is output at terminal 26. Although the particular characteristics of the reconstructed signal 84 will be discussed in more detail below, suffice it so say that signal 84 is substantially identical to the input signal 80 except that it is delayed in time by a predetermined period.

As is shown in the more detailed schematic diagram of FIG. 2, the bucket brigade delay line 10 includes a series of like data storage stages 40, and an output stage 41. Each storage stage 40 includes a voltage follower amplifier 42, a gate 43, and a capacitor 44. Input gate 43 of the first steps responds to each clock pulse 76 to sample the signal input at 12 and causes the sampled input to charge the first stage capacitor 44 to the voltage level of the sampled segment. Capacitor 44 then holds the sampled voltage until the gate 43' of the next stage 40 opens in response to the next pulse 72 and causes the charge on capacitor 44 to be transferred to the capacitor 44'. The gates 43 of the following stages likewise sequentially open and close in response to the input timing signals thereby transferring each pulse through each storage element in succession. Following storage in the last stage 40, each sampled voltage is output on line 18 as gate 45 of output stage 41 responds to the clock pulses 76.

The number of storage stages 40 in the series and the internal switching rate of the stage gates, determine the length of the time that the samples are delayed in passing through delay line 10. Stated more generally, the timing signals applied to input 16 determine the rate at which the input signal is sampled and the rate at which the samples are output on line 18; and together with the timing signals applied to input 14, determines the rate at which the samples pass through the delay line.

By schematic representation, sample-and-hold circuit 20 is shown to include an input amplifier 46, a gate 47, a capacitor 48, and an output amplifier 49. Gate 47 may be comprised of any suitable switching circuit capable of coupling an input voltage to capacitor 48 each time a timing pulse appears on line 24. Accordingly, each time gate 47 is turned on, capacitor 48 is charged through amplifier 46 to a voltage level proportional to the voltage level of the sample voltage pulse appearing at input 22 and holds that level until the next pulse is sampled. As will hereinafter be more fully explained, synchronization between gate 45 of delay line 10 and gate 47 is insured due to the fact that the timing signals for both gates are derived from a common source.

In a preferred embodiment, clock 28 includes two one-shot multivibrators 50 and 52, and a pair of amplifiers 54 and 56. Multivibrator 50 is triggered by leading edge level changes of the squarewave signal applied to terminal 30 and generates clocking pulses of short duration which are amplified by amplifier 54 and output at 32. Multivibrator 52 is triggered by trailing edge level changes of the same squarewave signal and generates pulses of the same amplitude and duration as the pulses generated by multivibrator 50 which are likewise amplified by amplifier 56 and output at 34. The duration of the pulses generated by multivibrators 50 and 52 is not critical so long as they do not overlap; typically, a duty factor of between 10% and 40% is acceptable. Thus, clock 28 generates two sets of timing pulses having equal amplitude and duration, but with one being 180° out of phase with the other.

Pulse stretcher 36 is a circuit used to expand the pulses generated by multivibrator 52 and includes a capacitor 58, a resistor 60, a diode 62 and an amplifier 64. This circuit has a fast rise time but a slow decay time as determined by the RC time constant of capacitor 58 and resistor 60. Thus, the leading edge of pulses passing through pulse stretcher 36 are not materially affected, but the trailing edges of such pulses are delayed by a predetermined length of time thereby increasing the duration of the pulses without changing the pulse rate of the timing signal.

FIG. 3 illustrates the time relationships of the timing signals used to control delay line 10 and sample-and-hold circuit 20. Signal 70 is a squarewave of uniform period that is generated exterior to the delay circuit. Signals 72 and 74 are the timing signals generated by multivibrators 50 and 52, respectively, and signal 76 is the time-expanded correspondent of signal 74 after expansion by pulse stretcher 36. The cross-hatched intervals 78 shown within the pulses of signal 76 represent those portions of the pulses 76 which are sampled by sample-and-hold circuit 20. Note that intervals 78 are coincident with the pulses of signal 74, since signals 74 and 76 are both derived from the output of multivibrator 52 and signal 74 controls sample-and-hold circuit 20.

FIG. 4 is included to illustrate the manner in which the delay operation is accomplished. Signal 80 represents an analog information signal as applied at input 12, signal 82 represents the series of sample voltage pulses corresponding to segments of signal 80 after having been sampled and delayed by delay line 10, and signal 84 represents the reconstructed information signal developed by sample-and-hold circuit 20 at output terminal 26. It should be noted that signal 84 is a stair-stepped continuous approximation of signal 80 which is delayed in time. Obviously, signal 84 will more closely approximate the waveform of signal 80 as the sampling rates of delay line 10 and sample-and-hold 20 are increased.

In operation, the externally generated squarewave 70 (FIG. 3) is received by clock 28 at input 30, and the information signal 80 (FIG. 4) is received by delay 10 at input 12. Multivibrators 50 and 52 are both activated by squarewave 70 and caused to generate the timing signals 72 and 74 which are of the same period but are 180° out of phase with each other. Timing signal 74 is then amplified by amplifier 56, expanded by pulse stretcher 36 and input to delay line 10 at input 16 where it determines both the rate at which information signal 80 is sampled by gate 43 of the first storage element 40 and the rate at which delayed pulses 82 are gated out of delay line 10. Timing signal 72 is amplified by amplifier 54 and input to delay line 10 at input 14 where it, along with timing signal 74, determines the internal rate at which the samples of input signal 80 are transferred through the stages 40 of delay line 10. Timing signal 74 is also input to sample-and-hold circuit 20 at input 24 where it determines the rate at which samples are taken from the output 18 of delay line 10.

As previously described, input information signal 80 is divided by delay line 10 into a plurality of sample voltage pulses equal in number and time to the timing pulses of signal 76 but which have voltage amplitudes proportional to the amplitudes of corresponding segments of signal 80. These pulse samples are passed through the several stages of delay line 10 at a rate determined by timing signals 72 and 76 until they reach output 18. As previously indicated, signal 74 controls the sampling rate of sample-and-hold circuit 20, and signal 76 controls the output rate of delay line 10. Because signals 74 and 76 are in phase and of the same frequency, but the pulses of signal 76 are longer in duration than the pulses of signal 74, the samples taken by sample-and-hold circuit 20 fall within the continuous portion of the sample voltage pulses 82 generated by delay line 10, and are thus not distorted due to infringement upon the trailing edges thereof. Sample-and-hold circuit 20 stores and continuously outputs the DC voltage level of each sample until another sample is taken, resulting in the generation of a stair-stepped reconstructed signal 84 at output 26 which very closely approximates the information signal 80 delayed in time by a predetermined period.

In an alternative embodiment utilizing delay lines 10 having a fixed number of storage elements 40, the delay time period may be expanded by cascading several delay lines between input terminal 12 and sample-and-hold circuit 20. In such an embodiment, clock 28 must be modified to provide additional timing signals 72 and 74, with each additional set of pulses having a reduced duty factor relative to the preceding set of pulses so that true samples will be taken by each delay line.

While there has been described what is at present considered to be the preferred embodiment of the invention, it will be understood that various alterations and modifications may be made therein, and it is intended to cover in the appended claims all such alterations and modifications as fall within the true spirit and scope of the invention.

What is claimed is:

1. Apparatus for time delaying an input analog information signal comprising:
   clock means for generating a first timing signal including a series of first pulses, and a second timing signal including a series of second pulses, said second pulses being 180° out of phase with said first pulses;
   pulse stretching means for expanding the duration of said second pulses to provide a series of stretched pulses having leading edges substantially time coincident with the leading edges of said second pulses, and trailing edges delayed relative to those of said second pulses;
   bucket brigade delay line means responsive to said first pulses and said stretched pulses and operative to sample successive segments of the input analog information signal and to generate a train of voltage pulses corresponding to said segments and having voltage amplitudes proportional thereto, said voltage pulses being time delayed relative to the corresponding information signal segments; and sample-and-hold means responsive to said second pulses and operative to sample each of said voltage pulses and to reconstruct an analog signal which is an approximation of the input analog information signal delayed by a predetermined time period.

2. Apparatus as recited in claim 1 wherein said clock means includes a first multivibrator for generating said first timing signal and a second multivibrator for generating said second timing signal, said first and second multivibrators being driven by a common input signal source.

3. Apparatus as recited in claim 1 wherein said sample-and-hold means includes a voltage storage element and a sampling gate driven by said second timing signal and operative to successively gate said voltage pulses into said voltage storage element.

4. Apparatus as recited in claim 3 wherein said clock means includes a first multivibrator for generating said first timing signal and a second multivibrator for generating said second timing signal, said first and second multivibrators being driven by a common input signal source.

5. Apparatus as recited in claim 3 wherein said phase stretcher means includes an amplifier having input circuitry including a series-connected resistor, a shunt-connected capacitor and a diode connected in parallel with said resistor, said diode being polarized such that the energy of said second timing pulses charges said capacitor independent of said resistor but causes discharge of said capacitor through said resistor thereby delaying the trailing edges of the pulses according to the RC time constant of the combination of said resistor and said capacitor.

6. Apparatus as recited in claim 1 wherein said sample-and-hold means includes a sampling gate and a voltage storage element for successively storing said voltage pulses as they are gated thereinto by said sampling gate and for continuously outputting the stored voltages to develop said reconstructed analog signal.

7. A signal delay circuit comprising:
   means for generating a first train of regularly spaced pulses of a first duration, a second train of regularly spaced pulses of the same duration as said first pulses but shifted in time by 180° relative thereto, and a third train of regularly spaced pulses of longer duration than said second pulses but having their leading edges substantially time coincident with said second pulses;
   a bucket brigade delay line responsive to said first and third pulses and operative to generate voltage pulses corresponding to segments of an input information signal and having voltage amplitudes proportional to said segments, said voltage pulses being time delayed relative to corresponding segments of said information signal; and
   an output device including a sample-and-hold means responsive to said second pulses and operative to sample said voltage pulses and to reconstruct therefrom an analog signal which is an approximation of the input information signal delayed by a predetermined time period.

8. A signal delay circuit as recited in claim 7 wherein said sample-and-hold means includes a voltage storage element and a sampling gate driven by said second pulses and operative to successively gate said voltage pulses into said voltage storage element.

9. A signal delay circuit as recited in claim 7 wherein said sample-and-hold means includes a sampling gate and a voltage storage element for successively storing said voltage pulses as they are gated thereto by said sampling gate and for continuously outputting the stored voltages to develop the reconstructed analog signal.

* * * * *